(12) United States Patent
Prudviraj Gunda et al.

(10) Patent No.: US 12,112,062 B2
(45) Date of Patent: Oct. 8, 2024

(54) WRITE PERFORMANCE BY RELOCATION DURING SEQUENTIAL READS

(71) Applicant: Western Digital Technologies, Inc., San Jose, CA (US)

(72) Inventors: Sridhar Prudviraj Gunda, Bangalore (IN); Yarriswamy Chandranna, Bangalore (IN)

(73) Assignee: Sandisk Technologies, Inc., Milpitas, CA (US)

( * ) Notice: Subject to any disclaimer, the term of this patent is extended or adjusted under 35 U.S.C. 154(b) by 57 days.

(21) Appl. No.: 17/356,999

(22) Filed: Jun. 24, 2021

(65) Prior Publication Data

US 2022/0413757 A1  Dec. 29, 2022

(51) Int. Cl.
| | |
|---|---|
| G06F 3/06 | (2006.01) |
| G11C 16/10 | (2006.01) |
| G11C 16/26 | (2006.01) |
| G11C 16/04 | (2006.01) |

(52) U.S. Cl.
CPC .......... *G06F 3/0659* (2013.01); *G06F 3/0611* (2013.01); *G06F 3/0679* (2013.01); *G11C 16/10* (2013.01); *G11C 16/26* (2013.01); *G11C 16/0483* (2013.01)

(58) Field of Classification Search
CPC .... G06F 3/0659; G06F 3/0611; G06F 3/0679; G11C 16/10; G11C 16/26; G11C 16/0483
USPC .......................................................... 711/103
See application file for complete search history.

(56) References Cited

U.S. PATENT DOCUMENTS

| | | | |
|---|---|---|---|
| 8,452,911 B2 | 5/2013 | Gorobets et al. | |
| 8,473,669 B2 | 6/2013 | Sinclair | |
| 8,819,328 B2 | 8/2014 | Lassa et al. | |
| 8,886,877 B1* | 11/2014 | Avila ................. | G06F 12/0246 |
| | | | 711/E12.008 |
| 9,396,202 B1 | 7/2016 | Drobychev et al. | |
| 9,940,033 B1 | 4/2018 | Alshawabkeh et al. | |
| 10,282,107 B1 | 5/2019 | Martin et al. | |
| 10,289,327 B2 | 5/2019 | Zevulun et al. | |
| 10,331,555 B1* | 6/2019 | Muthiah ............... | G06F 3/0656 |
| 10,521,287 B2 | 12/2019 | Khoueir et al. | |

(Continued)

OTHER PUBLICATIONS

Rewers, P., Trojanowska, J., Diakun, J., Rocha, A. and Reis, L.P., 2018. A study of priority rules for a levelled production plan. In: Hamrol, A., Ciszak, O., Legutko, S., Jurczyk, M. (eds) Advances in Manufacturing. Lecure Notes in Mechanical Engineering. Springer, Cham. (Year: 2018).

(Continued)

*Primary Examiner* — Gautam Sain
(74) *Attorney, Agent, or Firm* — Michael Best & Friedrich LLP

(57) ABSTRACT

A data storage device includes a non-volatile memory device including a memory block including a number of memory dies, and a controller coupled to the non-volatile memory device. A read command is received from an external device and the controller determines whether a read operation associated with the read command is a sequential read operation. One or more relocation operations are performed in response to determining that the read operation is a sequential read operation. The one or more relocation operations are executed in an order based on a priority associated with each of the one or more relocation operations.

14 Claims, 7 Drawing Sheets

(56) References Cited

U.S. PATENT DOCUMENTS

| | | | |
|---|---|---|---|
| 10,719,245 | B1 | 7/2020 | Gudipati et al. |
| 10,809,931 | B1 | 10/2020 | Martin et al. |
| 11,397,674 | B1* | 7/2022 | Jiang .................. G06F 3/067 |
| 2012/0297121 | A1 | 11/2012 | Gorobets et al. |
| 2014/0032817 | A1 | 1/2014 | Bux et al. |
| 2014/0344599 | A1 | 11/2014 | Branover et al. |
| 2015/0058535 | A1* | 2/2015 | Lasser ............. G11C 16/3495 |
| | | | 711/103 |
| 2015/0143026 | A1 | 5/2015 | Reddy et al. |
| 2016/0162215 | A1 | 6/2016 | Jayaraman et al. |
| 2016/0357471 | A1 | 12/2016 | Zevulun et al. |
| 2017/0024002 | A1 | 1/2017 | Tzafrir et al. |
| 2017/0177222 | A1* | 6/2017 | Singh .................. H04L 67/1097 |
| 2017/0285975 | A1* | 10/2017 | Trika .................... G06F 3/0659 |
| 2018/0107417 | A1 | 4/2018 | Shechter et al. |
| 2019/0347197 | A1 | 11/2019 | Lee et al. |
| 2020/0005871 | A1 | 1/2020 | Yang et al. |
| 2020/0110537 | A1 | 4/2020 | Hahn et al. |
| 2020/0210376 | A1* | 7/2020 | Vaideeswaran ..... G06F 11/0727 |
| 2020/0387447 | A1 | 12/2020 | Byun |
| 2020/0401341 | A1 | 12/2020 | Muthiah |
| 2021/0011845 | A1 | 1/2021 | Huang |
| 2021/0055878 | A1* | 2/2021 | Iwasaki ................ G06F 3/0608 |
| 2021/0073037 | A1 | 3/2021 | Arora et al. |
| 2021/0073119 | A1 | 3/2021 | Amaki et al. |
| 2021/0200297 | A1 | 7/2021 | Gada et al. |
| 2021/0405900 | A1 | 12/2021 | Kurita et al. |
| 2022/0155995 | A1* | 5/2022 | Jung ..................... G06F 3/0679 |

OTHER PUBLICATIONS

"Choi et al. ""Parallelizing Garbage Collection with I/O to Improve FlashResource Utilization,"" HPDC '18: The 27th International Symposium onHigh-Performance Parallel and Distributed Computing, Jun. 11-15, 2018 (pp. 243-254)".

Wang et al., "Assimilating Cleaning Operations with Flash-Level Parallelism for NAND Flash-Based Devices," 2014 IEEE International Conference on Computer and Information Technology (2014) (pp. 212-219).

Takai, Y., et al. "Analysis on Hybrid SSD Configuration with Emerging Non-Volatile Memories Including Quadruple-Level Cell (QLC) NAND Flash Memory and Various Types of Storage Class Memories (SCMs)." IEICE Transactions on Electronics 103.4 (2020): 171-180.

Yoo, S. et al. "Reinforcement Learning-Based SLC Cache Technique for Enhancing SSD Write Performance." in USENIX HotStorage. 2020 (7 pages).

\* cited by examiner

WRITE PERFORMANCE BY RELOCATION DURING SEQUENTIAL READS

FIELD

This application relates generally to data storage devices, and more particularly, to a controller that performs backup operations and/or relocation functions during sequential reads or idle times to improve read and write efficiency of the data storage device.

BACKGROUND

Generally, data storage devices perform various maintenance and/or garbage collection operations, such as memory block relocations, only when certain parameters are met. For example, when data blocks have low valid count values, the maintenance and/or garbage collection operations may be triggered. In some instances, when data has not been updated for a period of time, maintenance and/or garbage operations may be triggered and performed. This can result in decreased performance, as well as degradation of the memory dies within the data storage device. For example, the maintenance and/or garbage collection operations require both time and resources to be performed, which can adversely impact performance if triggered during an a read or write operation.

SUMMARY

General garbage collection and/or relocation functions are generally performed as needed within a data storage device. Performing the garbage collection and/or relocation functions during times where there are available resources on the data storage device can allow for more increased performance of the data storage device.

One embodiment of the present disclosure includes a data storage device including a non-volatile memory device including a memory block, the memory block including a number of memory dies, and a controller coupled to the non-volatile memory device. The controller is configured to receive a read command from an external device and determine whether a read operation associated with the read command is a sequential read operation. In response to determining that the read operation is the sequential read operation, the controller executes one or more relocation operations, wherein the one or more relocation operations are executed in an order based on a priority associated with each of the one or more relocation operations.

Another embodiment of the present disclosure includes a method performed by a data storage device having a controller coupled to a non-volatile memory device. The method includes receiving a read command from an external device and determining whether a read operation associated with the read command is a sequential read operation. The method also includes executing one or more relocation operations in response to determining that the read operation is the sequential read operation. The one or more relocation operations are executed in an order based on a priority associated with each of the one or more relocation operations.

Another embodiment of the present disclosure includes a data storage device including a non-volatile memory device including a memory block, the memory block including a number of memory dies and at least one flash management unit, and a controller coupled to the non-volatile memory device. The controller is configured to receive a read command from an external device and determine whether a read operation associated with the read command is a sequential read operation based on a consecutive quantity of flash management units being accessed and exceeding a predetermined threshold. In response to determining that the read operation is the sequential read operation, the controller executes one or more relocation operations, wherein the one or more relocation operations are executed in an order based on a priority associated with each of the one or more relocation operations. The priority is based on a time period required to complete the each of the one or more relocation operations.

Various aspects of the present disclosure provide for improvements in data storage devices. For example, optimizing thermal throttling processes based on various determined environmental parameters. The present disclosure can be embodied in various forms, including hardware or circuits controlled by software, firmware, or a combination thereof. The foregoing summary is intended solely to give a general idea of various aspects of the present disclosure and does not limit the scope of the present disclosure in any way.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the controller can be performed by hardware (for example, analog or digital circuits), a combination of hardware and software (for example, program code or firmware stored in a non-transitory computer-readable medium that is executed by a processor or control circuitry), or any other suitable means. The following description is intended solely to give a general idea of various aspects of the present disclosure and does not limit the scope of the disclosure in any way. Furthermore, it will be apparent to those of skill in the art that, although the present disclosure refers to NAND flash, the concepts discussed herein are applicable to other types of solid-state memory, such as NOR, PCM ("Phase Change Memory"), ReRAM, MRAM, etc.

Figure 1:
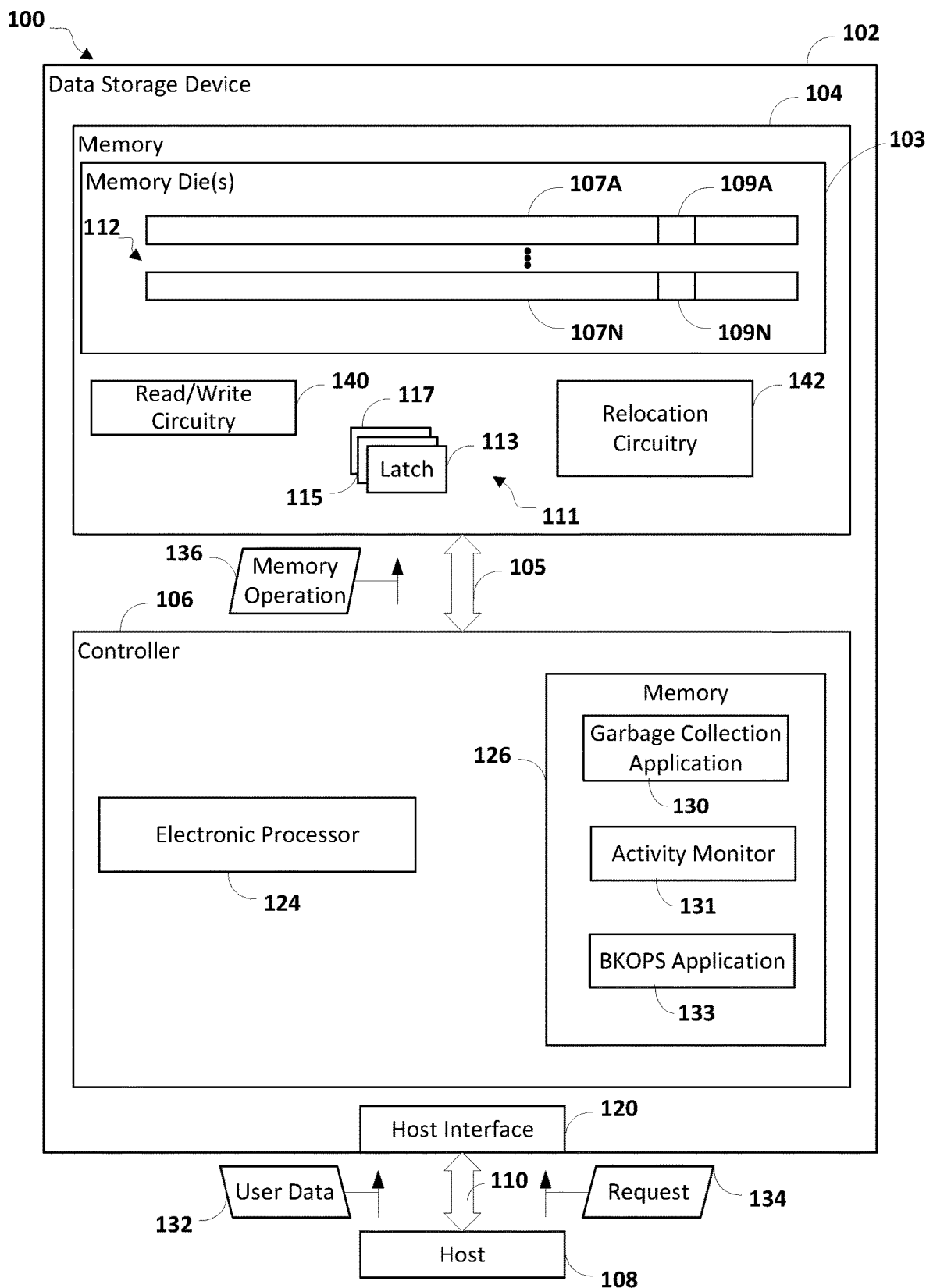
FIG. 1 is block diagram illustrating one example of a system including a data storage device, according to some embodiments.

FIG. 1 is a block diagram of one example of a system 100 that includes thermal throttling optimization, in accordance with some embodiments of the disclosure. In the example of FIG. 1, the system 100 includes a data storage device 102 in communication with a host device 108. The data storage device 102 includes a memory device 104 (e.g. non-volatile memory) that is coupled to a controller 106.

One example of the structural and functional features provided by the controller 106 are illustrated in FIG. 1. However, the controller 106 is not limited to the structural and functional features provided by the controller 106 in FIG. 1. The controller 106 may include fewer or additional structural and functional features that are not illustrated in FIG. 1.

The data storage device 102 and the host device 108 may be operationally coupled via a connection (e.g., a communication path 110), such as a bus or a wireless connection. In some examples, the data storage device 102 may be embedded within the host device 108. Alternatively, in other examples, the data storage device 102 may be removable from the host device 108 (i.e., "removably" coupled to the host device 108). As an example, the data storage device 102 may be removably coupled to the host device 108 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, or other suitable storage drives.

The data storage device 102 may be configured to be coupled to the host device 108 via the communication path 110, such as a wired communication path and/or a wireless communication path. For example, the data storage device 102 may include an interface 120 (e.g., a host interface) that enables communication via the communication path 110 between the data storage device 102 and the host device 108, such as when the interface 120 is communicatively coupled to the host device 108.

The host device 108 may include a processor and a memory. The memory may be configured to store data and/or instructions that may be executable by the processor. The memory may be a single memory or may include one or more memories, such as one or more non-volatile memories, one or more volatile memories, or a combination thereof. The host device 108 may issue one or more commands to the data storage device 102, such as one or more requests to erase data at, read data from, or write data to the memory device 104 of the data storage device 102. For example, the host device 108 may be configured to provide data, such as user data 132, to be stored at the memory device 104 or to request data to be read from the memory device 104. The host device 108 may include a mobile smartphone, a music player, a video player, a gaming console, an electronic book reader, a personal digital assistant (PDA), a computer, such as a laptop computer or notebook computer, any combination thereof, or other suitable electronic device.

The host device 108 communicates via a memory interface that enables reading from the memory device 104 and writing to the memory device 104. In some examples, the host device 108 may operate in compliance with an industry specification, such as a Universal Flash Storage (UFS) Host Controller Interface specification. In other examples, the host device 108 may operate in compliance with one or more other specifications, such as a Secure Digital (SD) Host Controller specification or other suitable industry specification. The host device 108 may also communicate with the memory device 104 in accordance with any other suitable communication protocol.

The memory device 104 of the data storage device 102 may include a non-volatile memory (e.g., NAND, BiCS family of memories, or other suitable memory). In some examples, the memory device 104 may be any type of flash memory. For example, the memory device 104 may be two-dimensional (2D) memory or three-dimensional (3D) flash memory. The memory device 104 may include one or more memory dies 103. Each of the one or more memory dies 103 may include one or more memory blocks 112 (e.g., one or more erase blocks). Each memory block 112 may include one or more groups of storage elements, such as a representative group of storage elements 107A-107N. The group of storage elements 107A-107N may be configured as a wordline. The group of storage elements 107A-107N may include multiple storage elements (e.g., memory cells that are referred to herein as a "string"), such as a representative storage elements 109A and 109N, respectively. In some examples, the storage elements 107A-107N may be referred to as flash management units ("FMU"). In other examples, an FMU may be equivalent to storage elements 109A and 109N. In one embodiment, an FMU is equivalent to the memory block 112 and may therefore be used interchangeably with the term "memory block."

The memory device 104 may include support circuitry, such as read/write circuitry 140 and relocation circuitry 142. Although depicted as a single component, the read/write circuitry 140 may be divided into separate components of the memory device 104, such as read circuitry and write circuitry. The read/write circuitry 140 may be external to the one or more memory dies 103 of the memory device 104. Alternatively, one or more individual memory dies 103 may include corresponding read/write circuitry 140 that is operable to read from and/or write to storage elements within the individual memory die independent of any other read and/or write operations at any of the other memory dies. The relocation circuitry 142 may be configured to perform one or more relocation functions to reallocate data within the memory dies 103. For example, the relocation circuitry 142 may be configured to perform relocation functions such as Single Level Cell ("SLC") to Single Level Cell compaction, Quad Level Cell ("QLC") to Quad Level Cell compaction, SLC-QLC compactions, and/or other relocation functions as required for a given application. Further, while Quad Level Cells are described herein, it is contemplated that Quad Level Cells may be any Multi-Level Cell ("MLC"). The memory device 104 may further include one or more latches (e.g., a set of latches 111 including latches 113, 115, and 117).

The controller 106 is coupled to the memory device 104 (e.g., the one or more memory dies 103) via a bus 105, an interface (e.g., interface circuitry), another structure, or a combination thereof. For example, the bus 105 may include multiple distinct channels to enable the controller 106 to communicate with each of the one or more memory dies 103 in parallel with, and independently of, communication with the other memory dies 103.

The controller 106 is configured to receive data and instructions from the host device 108 and to send data to the host device 108. For example, the controller 106 may send data to the host device 108 via the interface 120, and the controller 106 may receive data from the host device 108 via the interface 120. The controller 106 is configured to send data and commands (e.g., the memory operation 136, which may be a cycle operation of a memory block of the memory device 104) to the memory device 104 and to receive data from the memory device 104. For example, the controller 106 is configured to send data and a program or write command to cause the memory device 104 to store data to a specified address of the memory device 104. The write command may specify a physical address of a portion of the memory device 104 (e.g., a physical address of a word line of the memory device 104) that is to store the data.

The controller 106 is configured to send a read command to the memory device 104 to access data from a specified address of the memory device 104. The read command may specify the physical address of a region of the memory device 104 (e.g., a physical address of a word line of the memory device 104). The controller 106 may also be configured to send data and commands to the memory device 104 associated with background scanning operations, garbage collection operations, and/or wear-leveling operations, or other suitable memory operations.

The controller 106 may include a processor 124, a memory 126, and other associated circuitry. The memory 126 may be configured to store data and/or instructions that may be executable by the processor 124. The memory 126 may include a garbage collection application 130, an activity monitor 131, and a background operation ("BKOPS") module among other applications, programs, etc. The garbage collection application 130 and the activity monitor 131 may be a hardware circuit or instructions that are executable by the processor 124. While shown as being stored in the memory 126, in some examples the garbage collection application 130 and the activity monitor 131 may be configured as circuits within the memory device 104.

The garbage collection application 130 may be configured to execute one or more garbage collection operations associated with the memory device 104. For example, the garbage collection application 130 may communicate with the relocation circuitry 142 to perform one or more relocation operations as described herein. Other garbage collection operations may include mount table manager ("MTM") compaction, SAT consolidation, read scrub ("RS") operations, valid count ("VC") un-sync, and/or other garbage collection operations as required for a given application. In some embodiments, the garbage collection application 130 communicates with the relocation circuitry 142 to perform the various garbage collection operations. While shown in the memory 126 of the controller 106, in some examples, the garbage collection application 130 may be integrated into the memory device 104, such as within the relocation circuitry 142. The BKOPS application 133 is configured to perform or instruct the memory device, such as via the read/write circuitry and/or relocation circuitry 142 to perform, background operations as noted below.

The activity monitor 131 is configured to monitor activity associated with the one or more memory dies 103. For example, the activity monitor 131 may be configured to monitor one or more read and/or write commands received from the host device 108. In some examples, the activity monitor 131 is configured to monitor all read and/or write commends generated by the host device 108, as well as any other operational requests associated with the memory device 104. While shown in the memory 126 of the controller 106, in some examples, one or more individual memory dies 103 may include corresponding activity monitoring circuitry that is operable to perform one or more activity monitoring functions, described above, within the individual memory die 103 independently of any activity monitoring at any of the other memory dies 103.

Figure 2:
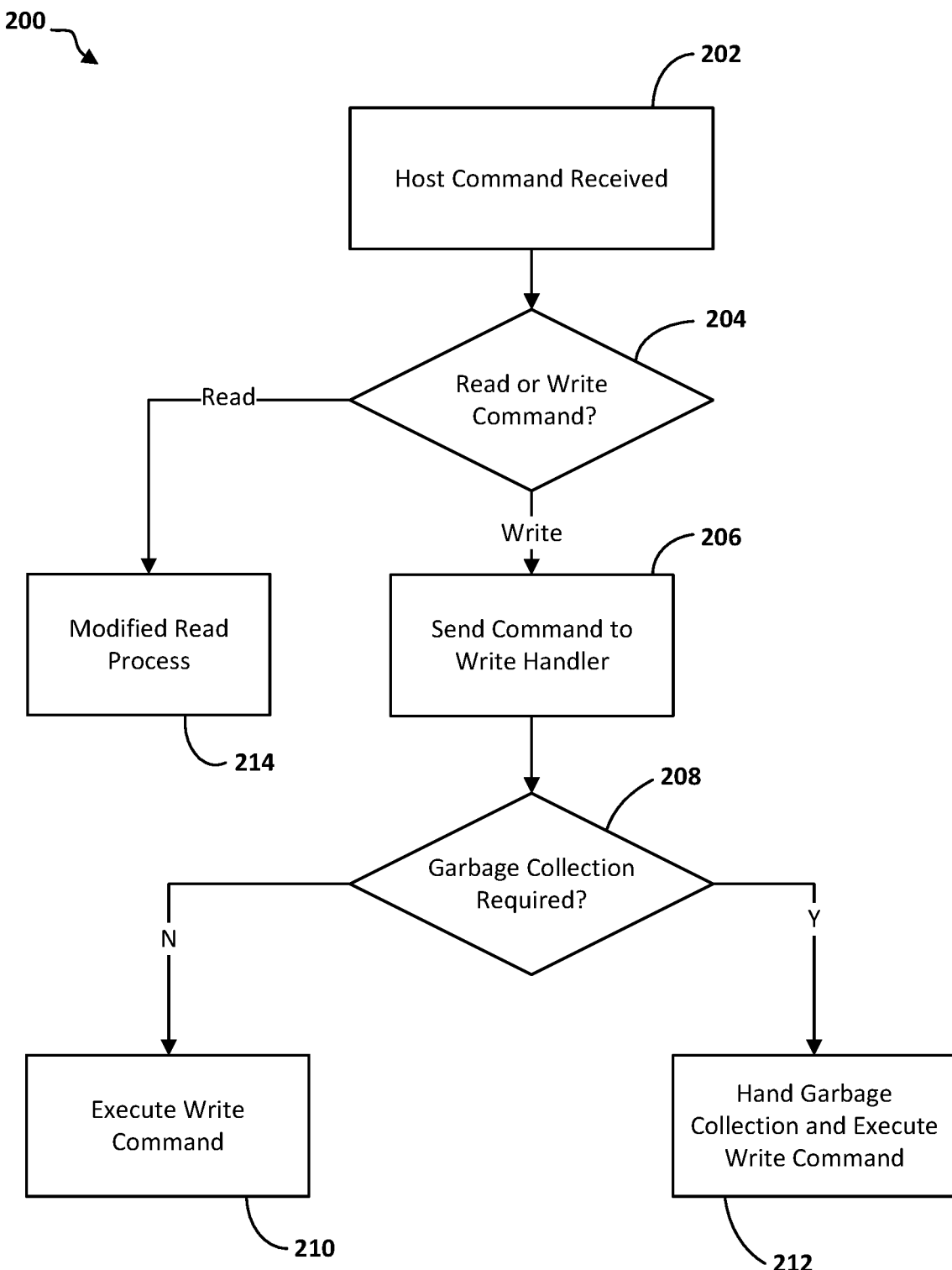
FIG. 2 is a flow chart illustrating a general read-write process for a data storage device, according to some embodiments.

Turning now to FIG. 2, a flow chart illustrating a general read-write process 200 for a data storage device, such as data storage device 102, is shown, according to some embodiments. At block 202, a host command is received from an external device, such as described above. For example, the host command may be received from host 108, described above. In one embodiment, the host command is received at the host interface 120.

At block 204, the host command is analyzed to determine whether the host command is a read command or a write command. In one embodiment, the controller 106 determines whether the host command is a read command or a write command. In response to determining that the host command is a write command at block 204, the write command is sent to a write handler within the data storage device 102 at block 206. For example, the write command may be sent to the electronic processor 124. In other examples, the write command is sent to the read/write circuitry 140.

At block 208, a determination as to whether one or more garbage collection operations are required is determined. In one embodiment, the garbage collection application 130 determines whether the one or more garbage collection operations are required. However, in other examples, other components such as the relocation circuitry 142 may be configured to determine whether the one or more garbage collection operations are required. Garbage collection operations are generally implemented in the flash translation layer ("FTL") of NAND-type memory to free previously invalidated memory space to allow for further write operations to be performed. Garbage collection generally eliminates the requirement that an entire memory block be erased prior to every write operation. In some examples, garbage collection processes may include one or more relocation operations to relocate valid data to new data blocks. As discussed above, example relocation operations may SLC-QLC folding, SLC-SLC compaction, QLC-QLC compaction, etc. In some examples, an SLC-SLC compaction and/or SLC-QLC folding operation may be performed where the number of available SLC blocks are below or almost below a minimum threshold, such as 10%. However, minimum threshold values of more than 10% or less than 10% may also be used as appropriate for a given application. In other examples, a QLC-QLC compaction operation may be performed where the number of available QLC blocks are below or almost below a minimum threshold, such as 10%. However, minimum threshold values of more than 10% or less than 10% may also be used as appropriate for a given application.

In response to determining that garbage collection is not required, the write command is executed at block 210. In one embodiment, the write command is executed by the read/write circuitry 140. In response to determining that garbage collection is required, the write command is executed and garbage collection functions are performed at block 212. In one embodiment, the garbage collection application 130 performs the required garbage collection functions. In other embodiments, the garbage collection application 130 interfaces with the relocation circuitry 142 to perform the required garbage collection operations.

In response to determining that the received host command is a read command, a modified read process is performed at block 214. In typical systems, the read operation is generally performed upon the host command being determined to be a read command. However, in the process 200, the modified read process is performed, as described in more detail below.

Figure 3:
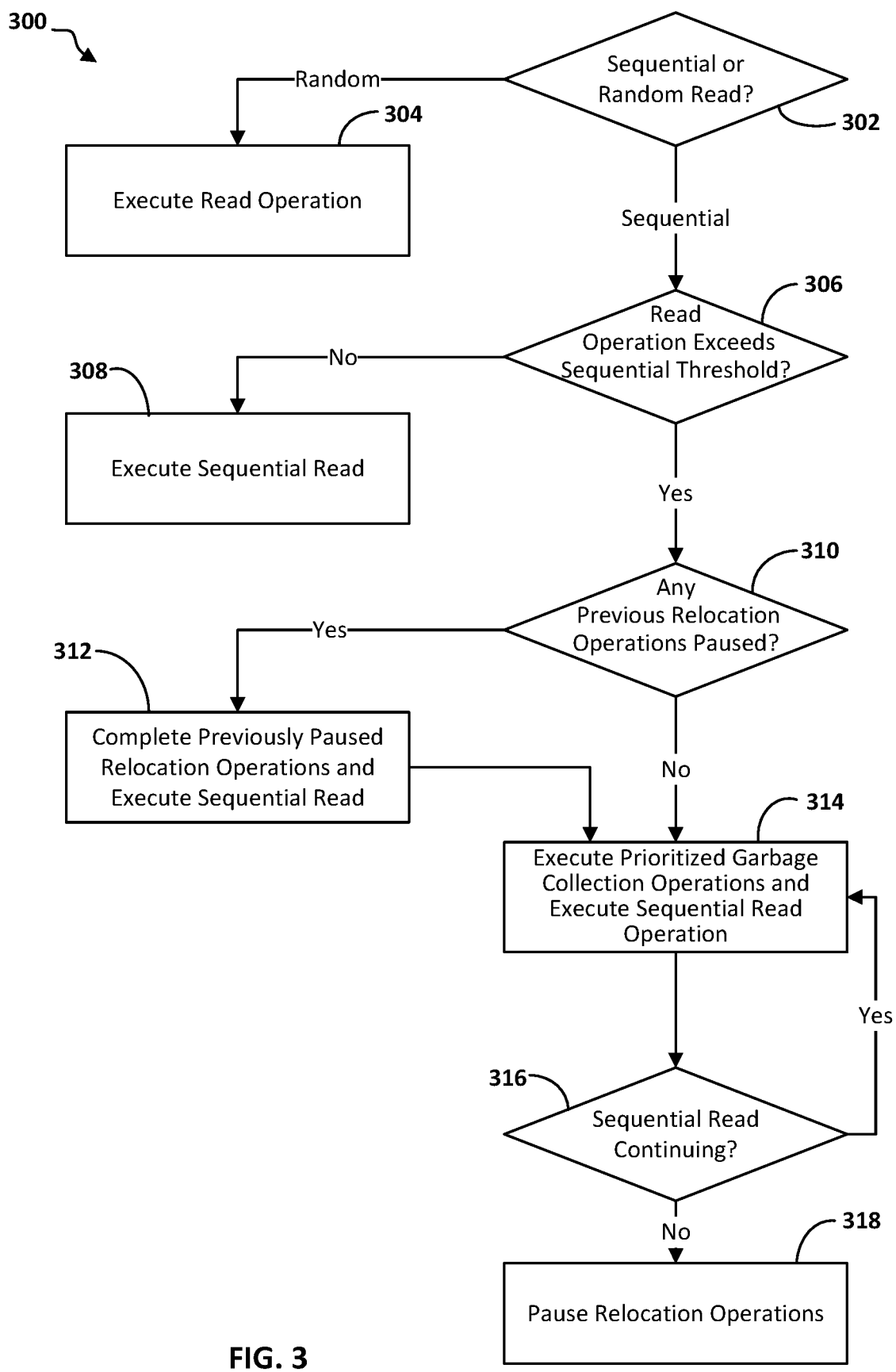
FIG. 3 is a is a flow chart illustrating a modified read process, according to some embodiments.

Turning now to FIG. 3, a flow chart illustrating a modified read process 300 is provided, according to some embodiments. In one embodiment, the process 300 is executed at block 214 of process 200. At block 302, a determination is made as to whether the read operation associated with the read command is a sequential read or a random read. In some embodiments, the electronic processor 124 determines whether the read operation associated with the read command is a sequential read or a random read. In one embodiment, the read operation is determined to be a sequential read operation where the number of consecutive memory blocks and/or FMUs accessed by the read operation exceeds a predetermined threshold. In other embodiments, the read operation is determined to be a sequential read operation where the number of consecutive FMUs accessed by the read operation exceeds a predetermined threshold. As noted above, FMUs may be the equivalent to the above described memory blocks (e.g. memory blocks 112) or may be more granular divisions within a memory block, such as a string. For purposes of brevity and clarity, the following descriptions are described with regards with regards to memory blocks; however, it is understood that FMUs may be used in lieu or in conjunction with the term memory block for purposes of this application.

In one example, the predetermined threshold may be 100 kb of consecutive memory blocks. In other examples, the read may be determined to be a sequential read when one or more entire memory blocks are required to be read during the read operation. However, other methods of determining whether the read operation is a sequential read or a random read may also be performed by the controller 106. In response to determining that the read operation is a random read operation, the read operation is executed at block 304. In some embodiments, the predetermined threshold may be the same threshold used to determine whether the read operation is a random read operation or a sequential read operation.

In response to determining that the read operation is a sequential read operation, the read operation is analyzed to determine whether the sequential read exceeds a sequential threshold at block 306. In one embodiment, the controller 106 and/or the electronic processor 124 determine whether the sequential read exceeds the sequential threshold. In one embodiment, the sequential threshold may be a defined number of consecutively read memory blocks. For example, the sequential threshold may be 1 Mb of consecutively read memory blocks. However, values of more than 1 Mb or less than 1 Mb of consecutively read memory blocks are also contemplated. In response to the sequential read operation being determined to not exceed the sequential threshold, the requested sequential read operation is performed at block 308.

In response to the sequential read operation being determined to equal or exceed the sequential threshold, a determination is made as to whether any previous relocation operations have been paused at block 310. In one embodiment, the relocation circuitry 142 determines whether any previous relocation operations have been completed. The relocation circuitry 142 may communicate with the controller 106 to determine whether any relocation operations have been paused. In other examples, the garbage collection application 130 determines whether any previous relocation operations have been paused. In response to determining that previous relocation operations had been paused, the previous relocation operations are completed at block 312. Upon completing the paused relocation operations, prioritized garbage collection operations are performed at block 314 along with the performing the requested sequential reads. As noted above, the prioritized garbage collection operations may include QLC-QLC block compaction operations, SLC-SLC block compaction operations, and SLC-QLC block folding operations. In response to determining that no previous relocation operations were paused, garbage collection operations are performed at block 314 along with performing the requested sequential reads.

In one embodiment, the prioritized garbage collection operations are performed in priority order. The priority order of the garbage collection operations may be based on a latency time to perform each operation. For example, where the garbage collection operations are relocation operations, such as those described above, the relocation operation with the highest latency time will have the highest priority, and so on for the remaining relocation operations. In one embodiment, a QLC-QLC compaction operation may be a latency time of approximately 8.25 seconds. A QLC-SLC folding operation may have a latency time of approximately 3.8 seconds, and an SLC-SLC compaction may have a latency time of approximately 2.4 seconds. The above latency times are for exemplary purposes, and it is understood that latency times may vary based on different factors, such as data storage device type, controller type, electronic processor speed, etc. By prioritizing the relocation operations based on latency time, the longest latency time operations are performed first during the sequential read instead of during a write operation which may result in a loss in performance. In one embodiment, all of the highest priority relocation operations are completed before the next highest priority relocation operation are started to ensure that all the highest priority relocation operations are completed first. While the above prioritization of the relocation operations is based on latency time, in some embodiments other criteria, such as available memory space, data type, etc. may be used to prioritize the relocation operations.

At process block 316, a determination is made as to whether the sequential read is still being performed. In response to the performance of the sequential read being determined to be continued, the garbage collection operations and read operations are continued at block 314. In response to the performance of the sequential read being determined to not be continued, the garbage collection operations are paused and the read operations are stopped at block 318.

The above process 300 is configured to allow for certain garbage collection operations to be performed during sequential read operations. Typically, these garbage collection operations are performed during write operations, which may lead to a reduced performance. By utilizing the relative idleness of the memory device 104 and/or controller 106 during sequential reads, multiple relocations may be able to be performed during the sequential read. For example, a sequential read may be a movie or other video clip being accessed for a period of time. Where the sequential read is 100 seconds, 12 QLC-QLC compactions (using the above latency times) may be performed, resulting in up to 48 QLC blocks being freed. Similarly, 25 SCL-QLC folding operations may be performed, resulting in up to 100 SLC blocks being freed, etc.

Figure 4:
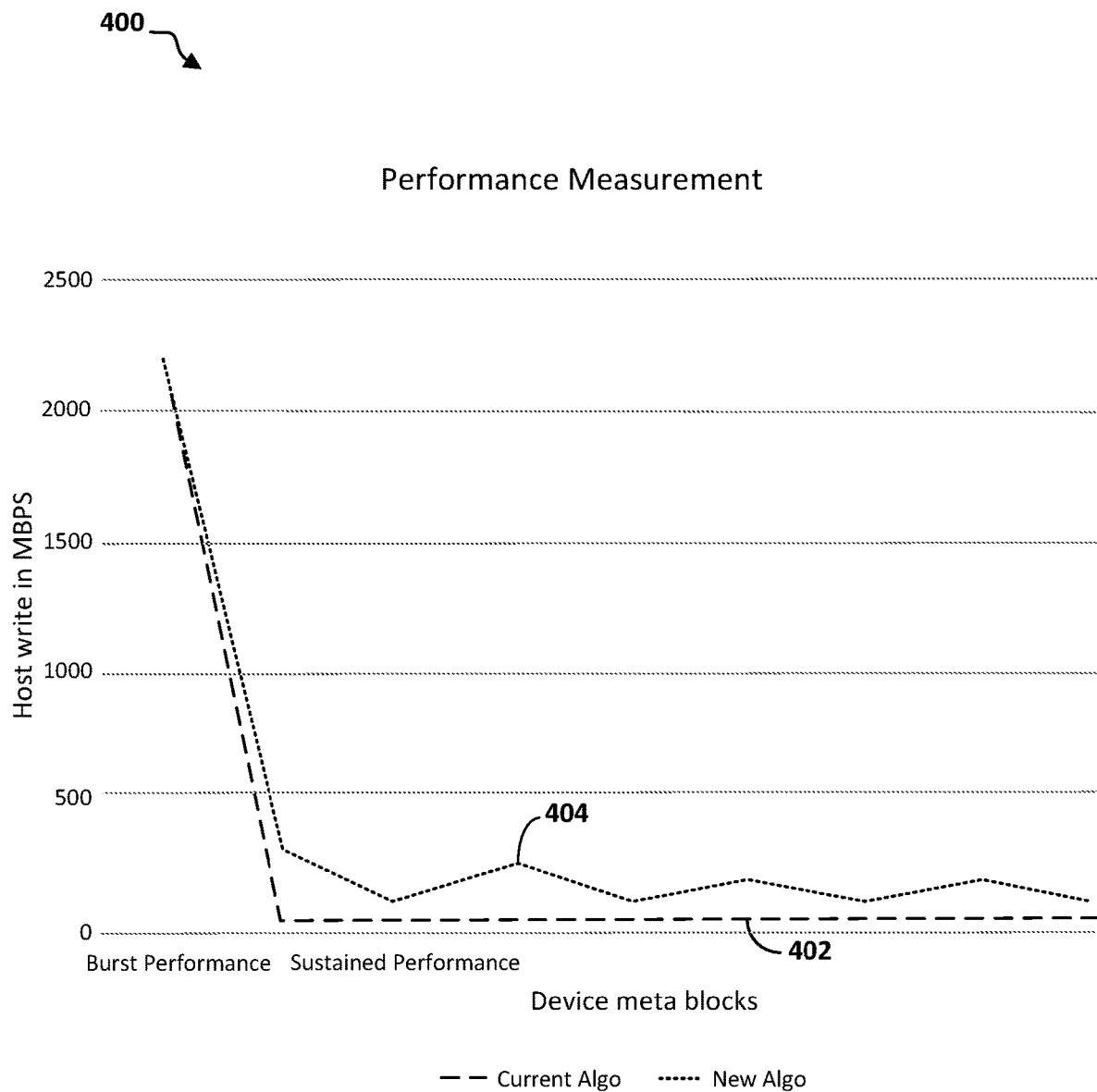
FIG. 4 is a graph illustrating write operations during a sustained write operation, according to some embodiments.

Turning now to FIG. 4, a graph 400 showing write operations during a sustained write operation is shown, according to some embodiments. Data line 402 illustrates the performance of a memory device not performing relocations during sequential reads. As shown in FIG. 4, after a burst write operation, the data storage device 102 is not able to recover performance beyond the minimal 40 MBPS speed due to the need to perform various relocation operations only during write operations. The data line 404 illustrates the performance of a data storage device 102 utilizing the process 300 described above. By handling relocation operations during sequential reads, the performance never falls to the 40 MBPS minimum speed as shown.

Figure 5:
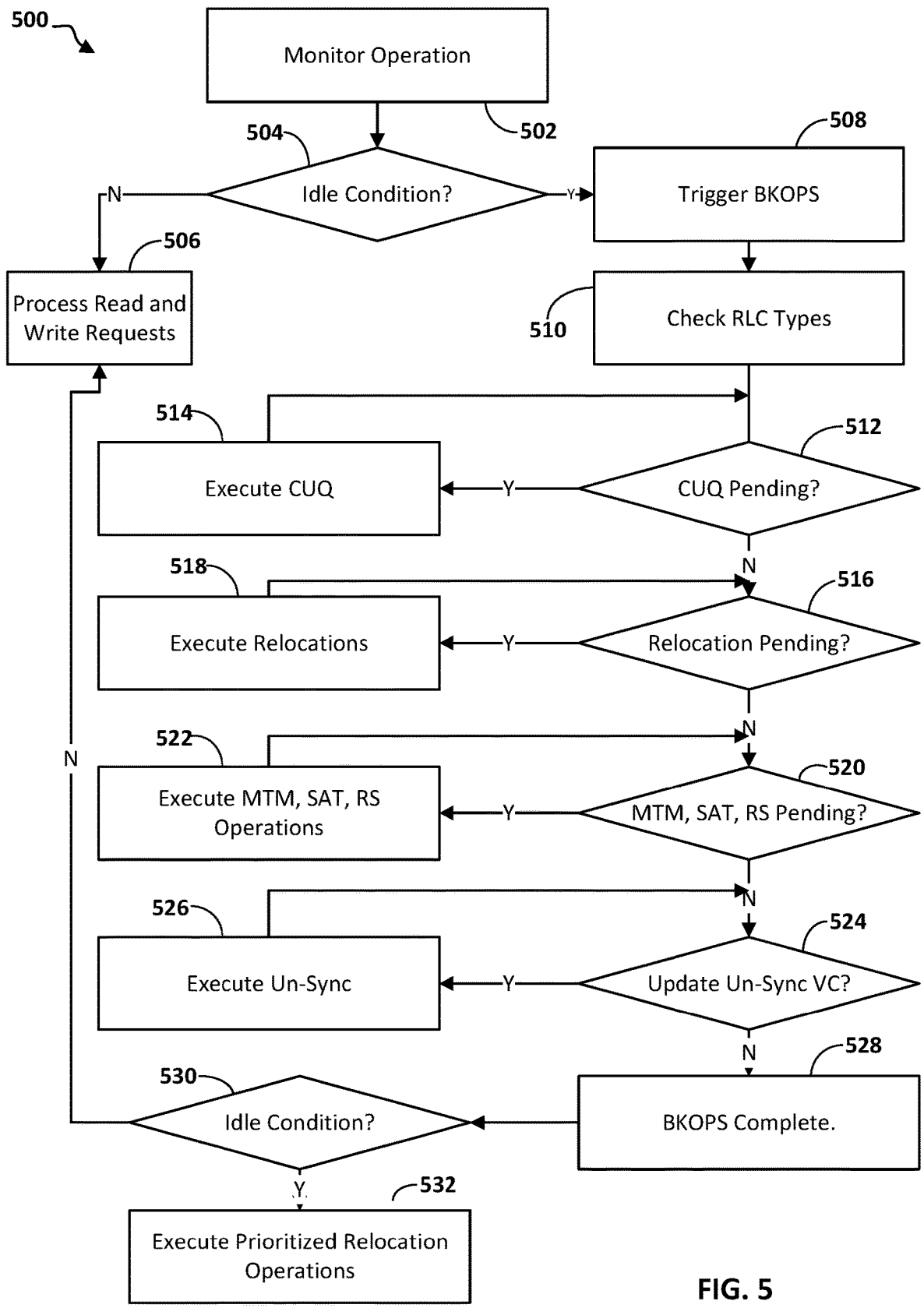
FIG. 5 is a flow chart illustrating a process for performing background operations during an idle time of a data storage device, according to some embodiments.

Turning now to FIG. 5, a process 500 for performing background operations during an idle time of a data storage device, such as data storage device 102, is shown, according to some embodiments. At block 502, the operation of the data storage device 102 is monitored. In some embodiments, the operation is monitored by the activity monitor 131. In some examples, the overall activity of the data storage device 102 is monitored by the activity monitor 131. In other examples, the activity for each individual memory device 104 and/or memory die 103 is monitored by the activity monitor 131.

At block 504, a determination is made as to whether the data storage device 102 is in an idle condition. In some examples, the activity monitor 131 determines whether an idle condition is present. However, in other examples, other components such as the controller 106, the electronic processor 124, and/or one or more devices within an individual memory device 104 may be used to determine the presence of an idle time. In some embodiments, an idle time is determined based on no activity (e.g. read/write requests) being detected for a predetermined period of time for an associated data storage device 102 and/or memory device 104. In one example, the predetermined period of time is 200 ms. However, times of more than 200 ms or less than 200 ms may also be used as appropriate for a given application.

In response to no idle time being determined, the read and write requests are transmitted and processed normally by the data storage device 102 at block 506. In response to determining that the data storage device 102 is in an idle condition, one or more BKOPS are triggered at block 508. In one embodiment, the BKOPS application 133 may trigger the BKOPS. In other embodiments, the relocation circuitry 142 may trigger the BKOPS. In still other embodiments, one or more other components, such as the controller 106 may trigger the one or more BKOPS. The BKOPS may include one or more background operations, such as garbage collection operations, relocation operations, etc. In some embodiments, the BKOPS are executed for each memory die 103 individually. In other embodiments, the below described BKOPS are applied globally to all memory dies 103 within the memory device 104. At block 510 any existing relocation command ("RLC") types are checked to see if there are any requested relocation commands pending or requested. Existing RLC types are checked to ensure there are no ongoing or paused RLC operations that may need to be completed prior to performing additional BKOPS, as described below. The BKOPS application 133 may be configured to check the existing RLC types. While the BKOPS application 133 is described as performing the following processes, it is contemplated that one or more other components, such as the controller 106, the electronic processor 124, the garbage collection application 130, the relocation circuitry 142 and/or the read/write circuitry 140 may perform the below described tasks as required for a given application.

At block 512, the BKOPS application 133 determines if a control update queue ("CUQ") is pending. The CUQ is a side queue where entries may be added when a log control synchronization ("CS") operation is performed. For example, during a CS any new request from the host 108 for a write request or update entry is added to the CUQ to ensure an efficient handling of CS and the items within the CUQ will performed after any CS process is completed. CS processes are periodical updates of control information to the memory dies 103 to ensure minimum recovery time is require during power-up after an unplanned shutdown.

In response to determining that at least one CUQ is pending, the CUQ is executed at block 514. In response to determining that no CUQ is pending, the BKOPS application 133 determines whether any relocation operations are pending at block 516. In response to determining that one or more relocation operations are pending, the relocation operations are performed at block 518.

In response to determining that no relocation operations are pending, the BKOPS application 133 determines whether any mount table manager ("MTM") compaction operations, SAT consolidation operations, or read scrub ("RS") operations pending at block 520. MTM compaction operations are performed when the logical mapping of each flash memory unit ("FMU") which are stored in the MTM and the number of available block falls below a predetermined threshold. For example, the predetermined threshold may be 10% of the total number of blocks. However, values of more than 10% or less than 10% are also contemplated. In other examples, the predetermined threshold may be a number of free MTM blocks. For example, in a data storage device having 26 MTM blocks, the predetermined threshold may be 2 free MTM blocks. However, predetermined thresholds of more than 2 free MTM blocks or less than 2 free MTM blocks are also contemplated as appropriate for a given application. SAT consolidation is the process of freeing space in a U-layer by writing several entries to MTM blocks, wherein the U-layer is a structure that resides in a RAM of the data storage device 102 for handing recent write operations. The write operations may be random or sequential. An RS may be required where constant reading of data blocks within the memory dies results in changes to the physical characteristics of the memory dies 103, resulting in data corruption. To avoid data corruption due to over reading certain memory blocks, periodic checks are performed on every memory block (e.g. SLC, QLC, etc.) when the block error rate ("BER") exceeds a predetermined threshold, whereupon the RS relocates the data to another block to avoid data corruption. In response to determining that one or more MTM compaction, SAT consolidation, and/or RS operations are pending, the relevant MTM compaction, SAT consolidations, and/or RS operations are executed at block 522.

In response to determining that there are no MTM compaction, SAT consolidation, and/or RS operations pending, the BKOPS application 133 determines if the valid count ("VC") needs to be un-synched at block 524. In some examples, the VC may become synced during an SAT consolidation process. In response to determining that a VC un-synch process is required, the VC is un-synched at block 526. In response to determining that no VC-un-synch process is required, a status message indicating that no BKOPS remain is provided to the controller 106 at block 528. In some embodiments, the BKOPS application 133 may provide the status message to the controller 106. In some embodiment, the BKOPS described above require approximately 1-2 seconds to complete. However, other data storage device types may require more time or less time to complete.

In response to receiving the message indicating that no BKOPS remain, it is determined as to whether the data storage device 102 and/or the memory device 104 remains in an idle condition at block 530. In response to determining that the data storage device 102 and/or the memory device 104 is not in an idle condition, read and write requests are transmitted and processed normally by the data storage device 102 at block 506. In response to determining that the data storage device 102 and/or the memory device 104 remains in the idle condition, a prioritized relocation algorithm is performed at block 532.

Figure 6:
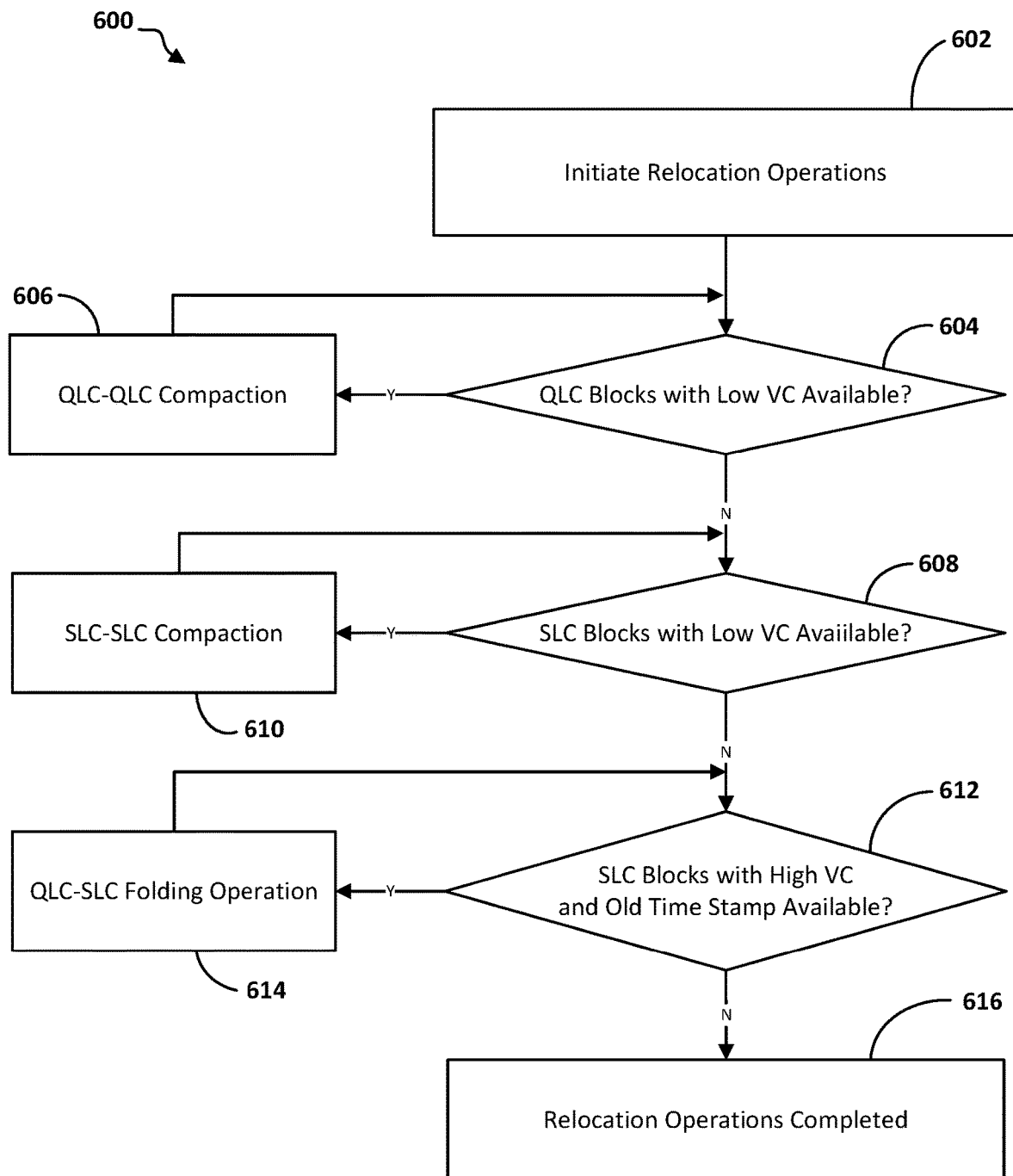
FIG. 6 is a flow chart illustrating a prioritized relocation process, according to some embodiments.

Turning now to FIG. 6, a flowchart illustrating a prioritized relocation process 600 is provided according to some embodiments. In one example, the prioritized relocation process is executed as described in regards to FIG. 5 above. At block 602, relocation operation handling is executed. In one embodiment, the garbage collection application 130 may communicate with the relocation circuitry 142 to execute the relocation handling. While the below operations are described with regards to the relocation circuitry 142, in some examples, the garbage collection application 130 and/or other circuitry within the data storage device 102 may be execute the relocation operations described below.

At block 604, the relocation circuitry 142 determines whether there are any QLC blocks with low VC availability. In some embodiments, QLC blocks may be determined to have low VC availability where the QLC block has less than 30% available VC. However, values of more than 30% availability and less than 30% availability are also contemplated. In response to determining that one or more QLC blocks have low VC availability, QLC-QLC block compaction is performed at block 606. In response to determining that no QLC blocks within the memory device 104 have low VC availability, the relocation circuitry 142 determines whether any SLC blocks in the memory device 104 have low VC availability at block 608. In some embodiments, SLC blocks may be determined to have low VC availability where the SLC block has less than 30% available VC. However, values of more than 30% availability and less than 30% availability are also contemplated. In response to determining that one or more SLC blocks have low VC availability, SLC-SLC block compaction is performed at block 610.

In response to determining that no SLC blocks have low VC availability, the relocation circuitry 142 determines whether any SLC blocks have a high VC and include "cold data" (e.g. data not recently closed) at block 612. Cold data may be determined based on the data not being closed or updated after a predetermined time has expired. In one embodiment, the predetermined time period may be 24 hours. However, values of more than 24 hours or less than 24 hours are also considered as required for a given application. SLC blocks may be determined to have high VC where the total available VC is greater than 75%. However, values of more than 75% and less than 75% are also considered as required for a given application. In response to determining that one or more SLC blocks have high VC availability and include cold data, SLC-QLC block folding operations are completed at process block 614.

In one embodiment, the relocation operations performed within the prioritized relocation process 600 are performed in priority order. For example, the priority of the relocation operations may be based on a latency time require to perform each operation. For example, the relocation operation with the highest latency time will have the highest priority, and so on for the remaining relocation operations. In one embodiment, a QLC-QLC compaction operation may be a latency time of approximately 8.25 seconds. A QLC-SLC folding operation may have a latency time of approximately 3.8 seconds, and an SLC-SLC compaction may have a latency time of approximately 2.4 seconds. The above latency times are for exemplary purposes, and it is understood that latency times may vary based on different factors, such as data storage device type, controller type, electronic processor speed, etc. By prioritizing the relocation operations based on latency time, the longest latency time operations are performed first during the sequential read instead of during a write operation which may result in a loss in performance. In one embodiment, the all highest priority relocation operations are completed before the next highest priority relocation operation are started to ensure that all the highest priority relocation operations are completed first. While the above prioritization of the relocation operations is based on latency time, in some embodiments other criteria such as available memory 126 space, data type, etc. may be used to prioritize the relocation operations.

In response to the relocation circuitry 142 determining that no SLC blocks have high VC and include cold data, the relocation circuitry 142 provides an indication that the relocation operations are completed at block 616. In one embodiment, the indication is provided to the controller 106 and/or the garbage collection application 130. While not shown in FIG. 6, the process 600 may be halted at any time where the data storage device 102 and/or the memory device 104 is determined to no longer be in an idle state, such as where read and/or write commands are issued to the data storage device 102 and/or the memory device 104. The above relocation operations are configured to clear space in the available SLC and QLC pool without increasing write amplification, thereby reducing the degradation of the expected life of the data storage device and/or memory device 104.

Figure 7:
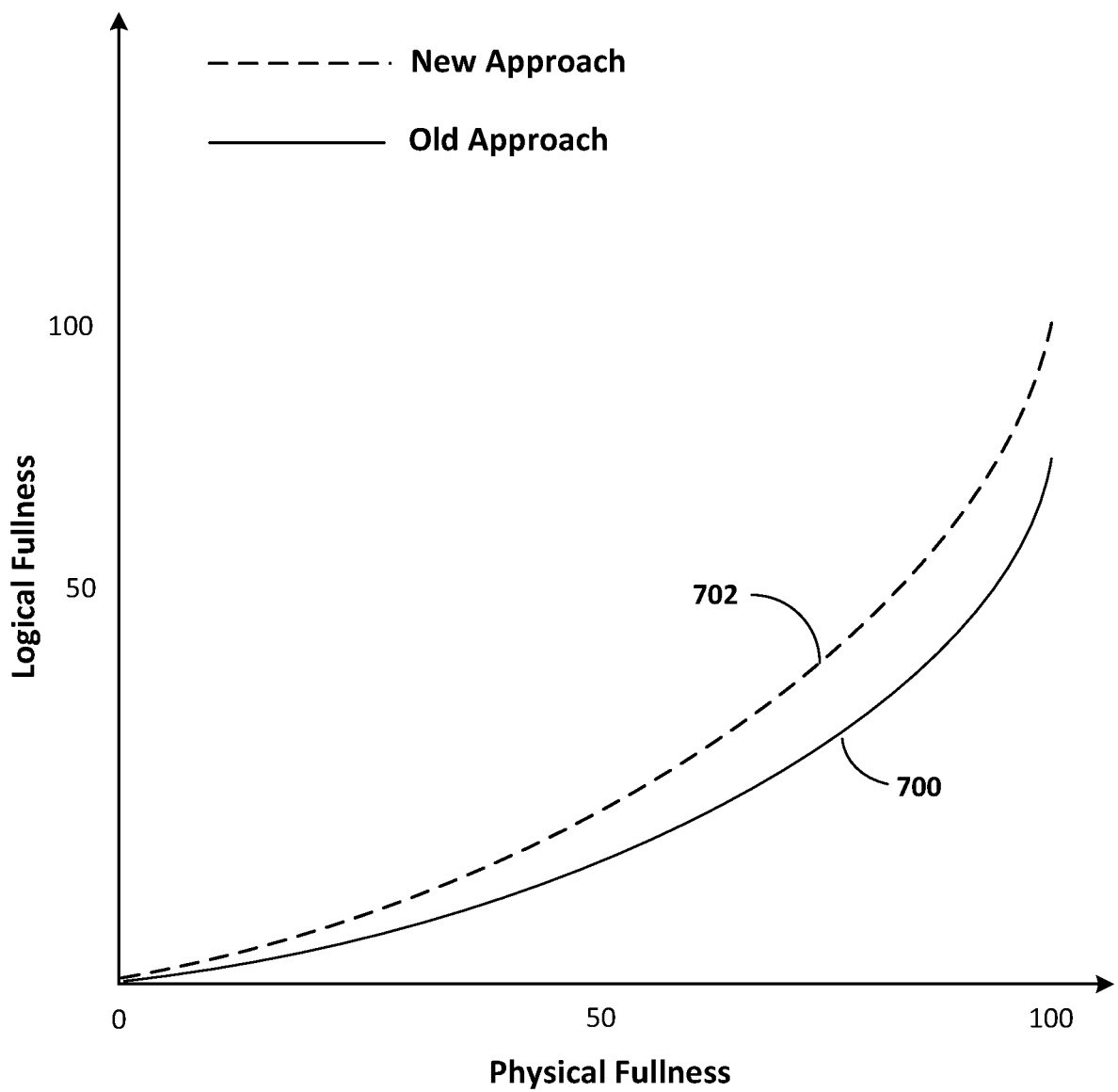
FIG. 7 is a chart illustrating the ratio of logical memory fullness to physical memory fullness, according to some embodiments.

Turning now to FIG. 7, a graph illustrating the ratio of logical memory fullness to physical memory fullness is shown, according to some embodiments. Data plot 700 illustrates performance a previous approach to performing BKOPS during an idle condition, such as where the BKOPS function only performs the operations 512-524 and does not subsequently perform the prioritized relocation process 600. Data plot 702 illustrates a performance using both the BKOPS in FIG. 5, and the priority relocation process 600. Generally, physical fullness of memory occurs significantly earlier than logical fullness due to padding, overlap writes, control data updates, and/or more invalidations on SLC or QLC blocks. In previous approaches, such as those shown in data plot 700, relocation operations are triggered based on the threshold of remaining free blocks within a memory. Due to this, no compaction or folding operations are performed until the threshold of remaining fee blocks is met, which may result in invalid data and can cause physical fullness to occur substantially earlier than logical fullness. This can impact performance of the memory device substantially once the physical fullness reaches a critical level. By utilizing the prioritized relocation process 600 during idle periods, relocation operations, such as QLC-QLC compaction, SLC-SLC compaction, and SLC-QLC folding during times where physical fullness is at lower levels, performance improvement, such as logical fullness shown on data plot 702, is achieved.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A data storage device, comprising:
a non-volatile memory device including a plurality of memory blocks, the memory blocks including a plurality of memory dies; and
a controller coupled to the non-volatile memory device and configured to:
receive a read command from an external device,
determine whether a read operation associated with the read command is a sequential read operation, and
in response to determining that the read operation is the sequential read operation, executing one or more relocation operations, wherein the one or more relocation operations are executed in an order based on a priority order associated with each of the one or more relocation operations,
wherein the priority is based on a type of relocation operation associated with the each of the one or more relocation operations,
wherein the one or more relocation operations comprise one or more of a Quad Level Cell ("QLC")-QLC compaction operation type, a Single Level Cell ("SLC")-SLC compaction operation type, and an SLC-QLC folding operation type, and
wherein the QLC-QLC compaction operation type has a higher priority order than the SLC-SLC compaction operation type and the SLC-QLC folding operation type.

2. The data storage device of claim 1, wherein the read operation is determined to be the sequential read operation based on a consecutive quantity of memory blocks being accessed and exceeding a predetermined threshold.

3. The data storage device of claim 1, wherein the SLC-SLC compaction operation type has a higher priority order than the SLC-QLC folding operation type.

4. The data storage device of claim 1, wherein the priority order associated with each of the one or more relocation operations is based on a time period required to complete the each of the one or more relocation operations.

5. The data storage device of claim 4, wherein a first time period has a higher priority order than a second time period, where the first time period is greater than the second time period.

6. A method performed by data storage device having a controller coupled to a non-volatile memory device, the method comprising:
receiving a read command from an external device;
determining whether a read operation associated with the read command is a sequential read operation; and
executing one or more relocation operations in response to determining that the read operation is the sequential read operation, wherein the one or more relocation operations are executed in an order based on a priority order associated with each of the one or more relocation operations, wherein the priority order is associated with a type of the each of the one or more relocation operations, and wherein the one or more relocation operations comprise one or more of a Quad Level Cell ("QLC")-QLC compaction operation type, a Single Level Cell ("SLC")-SLC compaction operation type, and an SLC-QLC folding operation type;
wherein the QLC-QLC compaction operation type has a higher priority order than the SLC-SLC compaction operation type and the SLC-QLC folding operation type.

7. The method of claim 6, wherein the read operation is determined to be the sequential read operation based on a consecutive quantity of memory blocks being accessed and exceeding a predetermined threshold.

8. The method of claim 6, wherein the SLC-SLC compaction operation type has a higher priority order than the SLC-QLC folding operation type.

9. The method of claim 6, wherein the priority order associated with each of the one or more relocation operations is based on a time period required to complete the each of the one or more relocation operations.

10. The method of claim 9, wherein a first time period has a higher priority order than a second time period, where the first time period is greater than the second time period.

11. A data storage device, comprising:
a non-volatile memory device including a memory block, the memory block including a plurality of memory dies and at least one flash management unit; and
a controller coupled to the non-volatile memory device and configured to:
receive a read command from an external device;
determine whether a read operation associated with the read command is a sequential read operation based on a consecutive quantity of flash management units being accessed and exceeding a predetermined threshold; and
in response to determining that the read operation is the sequential read operation, executing one or more relocation operations, wherein the one or more relocation operations are executed in an order based on a priority order associated with a type of each of the one or more relocation operations, wherein the priority order is based on a time period required to complete the each of the one or more relocation operation types, wherein the one or more relocation operations comprise one or more of a Quad Level Cell ("QLC")-QLC compaction operation type, a Single Level Cell ("SLC")-SLC compaction operation type, and an SLC-QLC folding operation type, and wherein the QLC-QLC compaction operation type has a higher priority order than the SLC-SLC compaction operation type and the SLC-QLC folding operation type.

12. The data storage device of claim 11, wherein the predetermined threshold is 100 kb.

13. The data storage device of claim 11, wherein the SLC-SLC compaction operation type has a higher priority order than the SLC-QLC folding operation type.

14. The data storage device of claim 11, wherein a first time period has a higher priority order than a second time period, where the first time period is greater than the second time period.

\* \* \* \* \*